US012562343B2

(12) United States Patent
Ikeda

(10) Patent No.: US 12,562,343 B2
(45) Date of Patent: Feb. 24, 2026

(54) PLASMA PROCESSING METHOD AND PLASMA PROCESSING DEVICE

(71) Applicant: TOKYO ELECTRON LIMITED, Tokyo (JP)

(72) Inventor: Taro Ikeda, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 416 days.

(21) Appl. No.: 18/271,635

(22) PCT Filed: Jan. 6, 2022

(86) PCT No.: PCT/JP2022/000263
§ 371 (c)(1),
(2) Date: Jul. 10, 2023

(87) PCT Pub. No.: WO2022/158307
PCT Pub. Date: Jul. 28, 2022

(65) Prior Publication Data
US 2024/0055231 A1 Feb. 15, 2024

(30) Foreign Application Priority Data

Jan. 19, 2021 (JP) ................................. 2021-006256

(51) Int. Cl.
*H01J 37/32* (2006.01)
*C23C 16/455* (2006.01)
(52) U.S. Cl.
CPC .... *H01J 37/3244* (2013.01); *C23C 16/45523* (2013.01); *H01J 37/32165* (2013.01); *H01J 37/32339* (2013.01)
(58) Field of Classification Search
CPC ............. H01J 37/3244; H01J 37/32165; H01J 37/32339; H01J 37/32091; C23C 15/505; C23C 15/45523; H01L 21/31; H05H 1/46

USPC ....... 118/723 MW, 723 ME, 723 E; 427/569, 427/575, 585; 156/345.43, 345.44, 156/345.47
See application file for complete search history.

(56) References Cited

U.S. PATENT DOCUMENTS

2011/0097823 A1* 4/2011 Tsuda .................. H01L 21/0262
118/706

FOREIGN PATENT DOCUMENTS

JP 2001-274099 A 10/2001

OTHER PUBLICATIONS

PCT International Search Report, PCT Application No. PCT/JP2022/000263, Mar. 1, 2022, 8 pages (with English translation of International Search Report).

* cited by examiner

*Primary Examiner* — Rodney G McDonald
(74) *Attorney, Agent, or Firm* — Fenwick & West LLP

(57) ABSTRACT

There is provided a plasma processing method comprising: continuously introducing electromagnetic waves into a chamber of a plasma processing apparatus, the electromagnetic waves being VHF waves or UHF waves, the electromagnetic waves being introduced into the chamber so as to form standing waves within the chamber along a lower surface of an upper electrode of the plasma processing apparatus; periodically applying a negative voltage to the upper electrode while performing said continuously introducing the electromagnetic waves; and supplying a processing gas into the chamber only during a period in which the negative voltage is applied to the upper electrode.

11 Claims, 7 Drawing Sheets

PLASMA PROCESSING METHOD AND PLASMA PROCESSING DEVICE

TECHNICAL FIELD

Exemplary embodiments of the present disclosure relate to a plasma processing method and a plasma processing apparatus.

BACKGROUND

A plasma processing apparatus is used for plasma processing of a substrate. Patent Document 1 below discloses a plasma processing apparatus using VHF waves as a type of plasma processing apparatus. The VHF waves are supplied to a high frequency electrode to generate a plasma from a gas within a chamber.

PRIOR ART DOCUMENTS

Patent Documents

Patent Document 1: Japanese Laid-open Patent Publication No. 2001-274099

SUMMARY

Problems to be Resolved by the Invention

The present disclosure provides techniques for uniforming density distribution of a plasma within a chamber.

Means for Solving the Problems

In one exemplary embodiment, a plasma processing method is provided. The plasma processing method comprises a step (a) of continuously introducing electromagnetic waves into a chamber of a plasma processing apparatus. The electromagnetic waves are VHF waves or UHF waves. The electromagnetic waves are introduced into the chamber so as to form standing waves within the chamber along a lower surface of an upper electrode of the plasma processing apparatus. The plasma processing method further comprises a step (b) of periodically applying a negative voltage to the upper electrode while performing the step of continuously introducing the electromagnetic waves. The plasma processing method further comprises a step (c) of supplying a processing gas into the chamber only during a period in which the negative voltage is applied to the upper electrode.

Effect of the Invention

According to one exemplary embodiment, it is possible to uniform density distribution of a plasma in a chamber.

DETAILED DESCRIPTION

Figure 1:
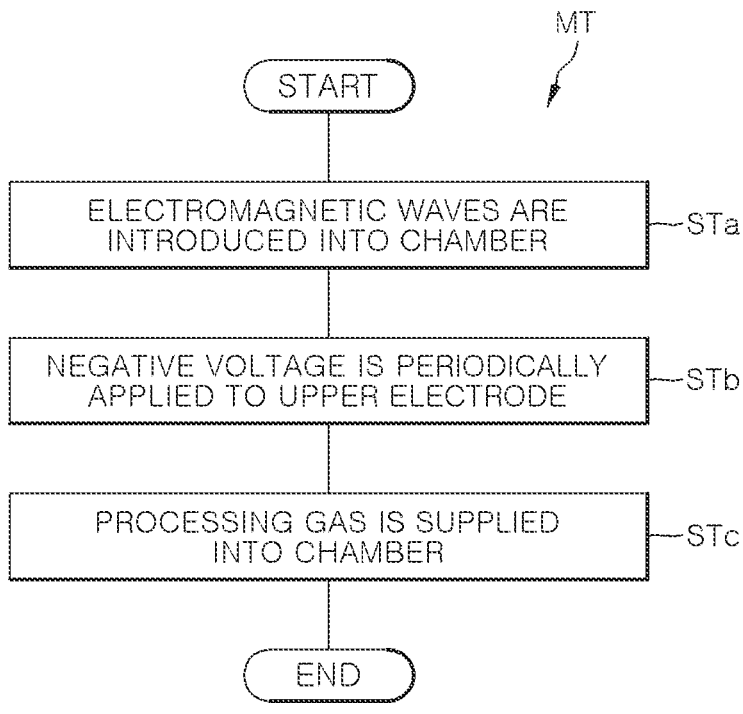
FIG. 1 is a flow diagram of a plasma processing method according to one exemplary embodiment.

Various exemplary embodiments are described below.

In one exemplary embodiment, a plasma processing method is provided. The plasma processing method comprises a step (a) of continuously introducing electromagnetic waves into a chamber of a plasma processing apparatus. The electromagnetic waves are VHF waves or UHF waves. The electromagnetic waves are introduced into the chamber so as to form standing waves within the chamber along a lower surface of an upper electrode of the plasma processing apparatus. The plasma processing method further comprises a step (b) of periodically applying a negative voltage to the upper electrode while performing the step of continuously introducing the electromagnetic waves. The plasma processing method further comprises a step (c) of supplying a processing gas into the chamber only during a period in which the negative voltage is applied to the upper electrode.

In the above embodiment, the processing gas is supplied into the chamber only during the period in which the negative voltage is applied to the upper electrode. During the period in which the negative voltage is applied to the upper electrode, a thickness of sheath directly below the upper electrode increases. When the thickness of the sheath directly below the upper electrode is large, a wavelength of electromagnetic waves along the lower surface of the upper electrode becomes longer. Therefore, according to the above embodiment, density distribution of a plasma generated from the processing gas in the chamber becomes uniform.

In one exemplary embodiment, the negative voltage may be a negative DC voltage periodically applied to the upper electrode.

In one exemplary embodiment, the negative voltage may be generated by shaping a waveform of a high frequency voltage to suppress a positive voltage contained in the high frequency voltage.

In one exemplary embodiment, the upper electrode may be connected to ground when the negative voltage is not applied to the upper electrode.

In one exemplary embodiment, a time length of a period in which the upper electrode is connected to ground may be 0.5 milliseconds or more in each cycle including the period in which the negative voltage is applied to the upper electrode.

In one exemplary embodiment, the plasma processing method may further comprise a step of supplying a source gas into the chamber. The processing gas may be a reducing gas that reduces source material adhered on a substrate from the source gas in the chamber.

In one exemplary embodiment, the source gas and the processing gas may be simultaneously supplied into the chamber during the period in which the negative voltage is applied to the upper electrode.

In another exemplary embodiment, a plasma processing apparatus is provided. The plasma processing apparatus comprises a chamber, a gas supply, a substrate support, an upper electrode, a first power supply, and a second power supply. The gas supply is configured to supply a processing gas into the chamber. The substrate support is provided within the chamber. The upper electrode is provided above the substrate support. The first power supply is configured to periodically apply a negative voltage to the upper electrode. The second power supply is configured to generate electromagnetic waves to generate a plasma from the processing gas in the chamber. The electromagnetic waves are VHF waves or UHF waves and are continuously introduced into the chamber so as to form standing waves in the chamber along a lower surface of the upper electrode. The gas supply is configured to introduce the processing gas into the chamber only during a period in which the negative voltage is applied to the upper electrode.

In one exemplary embodiment, the plasma processing apparatus further comprises an introduction part. The introduction part may be formed of a dielectric material and may be provided along an outer periphery of the upper electrode so as to introduce the electromagnetic waves into the chamber therethrough. The upper electrode may form a shower head which introduces the processing gas into the chamber.

In one exemplary embodiment, the first power supply may be configured to periodically apply a negative DC voltage to the upper electrode as the negative voltage. The plasma processing apparatus may further comprise a switch configured to connect the upper electrode to ground when the negative voltage is not applied to the upper electrode.

In one exemplary embodiment, the first power supply may be configured to generate a high frequency voltage. The plasma processing apparatus may further comprise a waveform shaper configured to shape a waveform of the high frequency voltage to suppress a positive voltage contained in the high frequency voltage.

Various exemplary embodiments are described in detail below with reference to the drawings. Components that are the same or equivalent in each drawing are identified by the same reference numerals.

FIG. 1 is a flow diagram of a plasma processing method according to one exemplary embodiment. The plasma processing method (hereinafter referred to as "method MT") shown in FIG. 1 is performed using a plasma processing apparatus.

Figure 2:
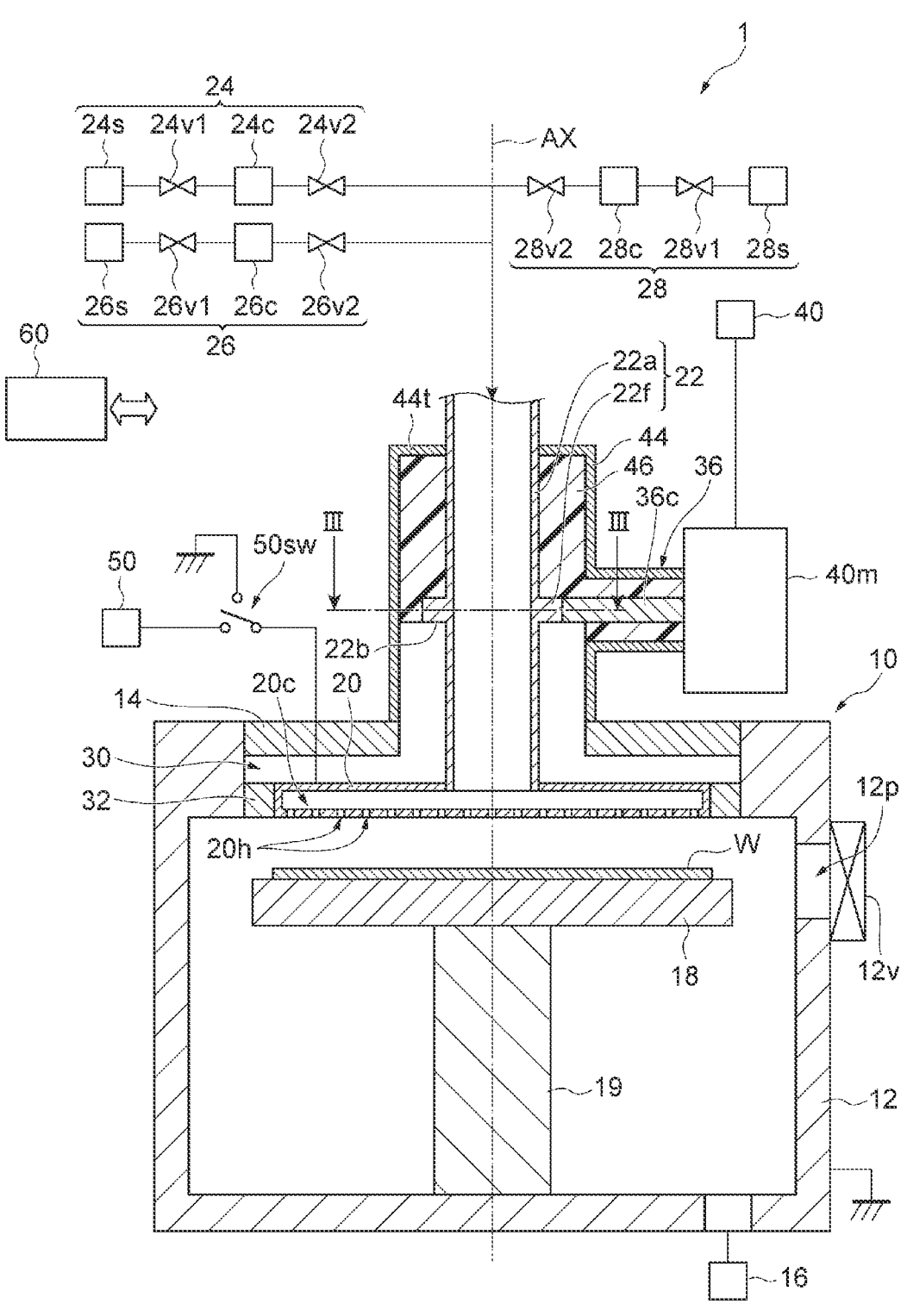
FIG. 2 is a diagram schematically showing a plasma processing apparatus according to one exemplary embodiment.

FIG. 2 is a diagram schematically showing a plasma processing apparatus according to one exemplary embodiment. The method MT can be performed using a plasma processing apparatus 1 shown in FIG. 2. The plasma processing apparatus 1 is a parallel plate type plasma processing apparatus. The plasma processing apparatus 1 is configured to generate a plasma using electromagnetic waves. The electromagnetic waves are VHF waves or UHF waves. The band of the VHF waves is 30 MHz to 300 MHz, and the band of the UHF waves is 300 MHz to 3 GHz.

The plasma processing apparatus 1 comprises a chamber 10. The chamber 10 defines an internal space. A substrate W is processed within the internal space of the chamber 10. The chamber 10 has an axis AX as a center axis. The axis AX is an axis extending in a vertical direction.

In one embodiment, the chamber 10 may include a chamber body 12. The chamber body 12 is substantially cylindrical in shape and has an opening at an upper portion thereof. The chamber body 12 provides a side wall and a bottom of the chamber 10. The chamber body 12 is formed of metal, such as aluminum. The chamber body 12 is grounded.

The side wall of the chamber body 12 provides a passage 12p. The substrate W passes through the passage 12p as it is transferred between the interior and exterior of the chamber 10. The passage 12p can be opened and closed by a gate valve 12v. The gate valve 12v is provided along the side wall of the chamber body 12.

The chamber 10 may further include a top wall 14. The top wall 14 is formed of metal, such as aluminum. The top wall 14 closes the opening at the upper portion of the chamber body 12 together with a cover conductor, which will be described later. The top wall 14 is grounded together with the chamber body 12.

The bottom of the chamber 10 provides an exhaust port. The exhaust port is connected to an exhaust device 16. The exhaust device 16 includes a pressure controller, such as an automatic pressure control valve, and a vacuum pump, such as a turbomolecular pump.

The plasma processing apparatus 1 further comprises a substrate support 18. The substrate support 18 is provided within the chamber 10. The substrate support 18 is configured to support the substrate W placed thereon. The substrate W is placed on the substrate support 18 in a substantially horizontal state. The substrate support 18 may be supported by a support member 19. The support member 19 extends upwardly from the bottom of the chamber 10. The substrate support 18 and the support member 19 may be formed of a dielectric, such as aluminum nitride.

The plasma processing apparatus 1 further comprises an upper electrode 20. The upper electrode 20 is formed of metal, such as aluminum. The upper electrode 20 is provided above the substrate support 18. The upper electrode 20 forms a ceiling defining the internal space of the chamber 10. The upper electrode 20 may have a substantially disk shape. The upper electrode 20 has the axis AX as a center axis.

In one embodiment, the upper electrode 20 forms a shower head. The upper electrode 20 may have a hollow structure. The upper electrode 20 provides a plurality of gas holes 20h. The plurality of gas holes 20h are open to the internal space of the chamber 10. The upper electrode 20 further provides a gas diffusion chamber 20c therein. The plurality of gas holes 20h are connected to the gas diffusion chamber 20c and extend downwardly from the gas diffusion chamber 20c.

The plasma processing apparatus 1 may further comprise a gas supply pipe 22. The gas supply pipe 22 is a cylindrical pipe. The gas supply pipe 22 is formed of metal, such as aluminum. The gas supply pipe 22 extends vertically above the upper electrode 20. The gas supply pipe 22 has the axis AX as a center axis. A lower end of the gas supply pipe 22 is connected to an upper center of the upper electrode 20. The upper center of the upper electrode 20 provides a gas inlet. The inlet is connected to the gas diffusion chamber 20c. The gas supply pipe 22 supplies a gas to the upper electrode 20. The gas from the gas supply pipe 22 is introduced into the chamber 10 from the plurality of gas holes 20h through the inlet of the upper electrode 20 and the gas diffusion chamber 20c.

In one embodiment, the plasma processing apparatus 1 may further comprise a gas supply 24, a gas supply 26, and a gas supply 28. The gas supply 24 is connected to the gas supply pipe 22. The gas supply 24 includes a gas source 24s, a primary valve 24v1, a flow controller 24c, and a secondary valve 24v2. The gas source 24s is a source of a source gas. The source gas may be a silicon-containing gas, such as a silane gas (e.g., SiH₄ gas or trimethylsilane gas), or a metal-containing gas, such as a metal halide gas (e.g., TiCl₄ gas). The gas source 24*s* is connected to the gas supply pipe 22 through the primary valve 24*v*1, the flow controller 24*c*, and the secondary valve 24*v*2.

The gas supply 26 is connected to the gas supply pipe 22. The gas supply 26 includes a gas source 26*s*, a primary valve 26*v*1, a flow controller 26*c*, and a secondary valve 26*v*2. The gas source 26*s*is a source of the processing gas. The processing gas may be any gas selected to process the substrate W with species from the plasma generated therefrom. In one embodiment, the processing gas may be a reducing gas that reduces source material adhered on the substrate W from the source gas. The processing gas may be a reducing gas such as $NH_3$ gas, $N_2$ gas, or $H_2$ gas. The gas source 26*s* is connected to the gas supply pipe 22 through the primary valve 26*v*1, the flow controller 26*c*, and the secondary valve 26*v*2.

The gas supply 28 is connected to the gas supply pipe 22. The gas supply 28 includes a gas source 28*s*, a primary valve 28*v*1, a flow controller 28*c*, and a secondary valve 28*v*2. The gas source 28*s* is a source of inert gas. The inert gas may be a noble gas such as Ar gas. The gas source 28*s* is connected to the gas supply pipe 22 through the primary valve 28*v*1, the flow controller 28*c*, and the secondary valve 28*v*2.

In one embodiment, the upper electrode 20 may be provided below the top wall 14. In this embodiment, a space between the upper electrode 20 and the top wall 14 forms a portion of a waveguide 30. The waveguide 30 also includes a space provided by the gas supply pipe 22 between the gas supply pipe 22 and the top wall 14.

The plasma processing apparatus 1 may further comprise an introduction part 32. The introduction part 32 is formed of a dielectric such as aluminum oxide. The introduction part 32 is provided along an outer periphery of the upper electrode 20 so as to introduce electromagnetic waves into the chamber 10 therethrough. The introduction part 32 has an annular shape. The introduction part 32 closes a gap between the upper electrode 20 and the chamber body 12, and is connected to the waveguide 30.

Figure 3:
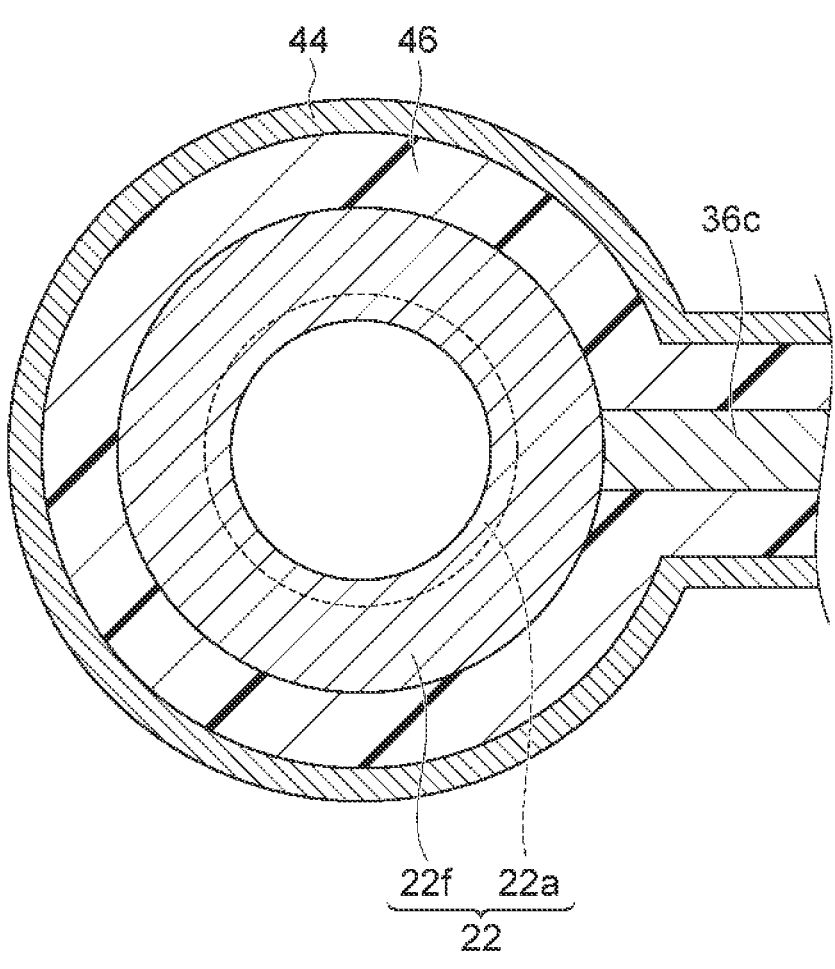
FIG. 3 is a cross-sectional view taken along III-III line in FIG. 2.

FIG. 3 will be referred to together with FIG. 2 below. FIG. 3 is a cross-sectional view taken along line III-III in FIG. 2. The gas supply pipe 22 described above may include an annular flange 22*f* in a portion of its longitudinal direction. The flange 22*f* radially projects from another portion 22*a* of the gas supply pipe 22.

The plasma processing apparatus 1 may further comprise an electromagnetic wave supply path 36. The supply path 36 includes a conductor 36*c*. The conductor 36*c* of the supply path 36 is connected to the gas supply pipe 22. Specifically, one end of the conductor 36*c* is connected to the flange 22*f*.

The plasma processing apparatus 1 further comprises a power supply 40 (second power supply). The other end of the conductor 36*c* may be connected to the power supply 40 via a matching box 40*m*. The power supply 40 is an electromagnetic wave generator. The matching box 40*m* has an impedance matching circuit. The impedance matching circuit is configured to match the load impedance of the power supply 40 to the output impedance of the power supply 40. The impedance matching circuit has a variable impedance. For example, the impedance matching circuit may be a it-type circuit.

The electromagnetic waves from the power supply 40 are introduced into the chamber 10 so as to form standing waves within the chamber 10 along a lower surface of the upper electrode 20. In the plasma processing apparatus 1, the electromagnetic waves from the power supply 40 are introduced into the chamber 10 from the introduction part 32 via the matching box 40*m*, the supply path 36 (conductor 36*c*), the gas supply pipe 22, and the waveguide 30 around the upper electrode 20. The electromagnetic waves excite the processing gas from the gas supply 26 in the chamber 10 to generate a plasma.

In one embodiment, the plasma processing apparatus 1 may further comprise a cover conductor 44 and a dielectric part 46. The cover conductor 44 has a substantially cylindrical shape. The cover conductor 44 surrounds the gas supply pipe 22 above the chamber 10. The cover conductor 44 is connected to the gas supply pipe 22 at its upper end 44*t*. That is, the upper end 44*t* of the cover conductor 44 closes a space between the cover conductor 44 and the gas supply pipe 22. A lower end of the cover conductor 44 is connected to the chamber 10. In one embodiment, the lower end of the cover conductor 44 may be connected to the top wall 14. The cover conductor 44 may surround the conductor 36*c*. A space between the cover conductor 44 and the conductor 36*c* may be filled with a dielectric. This dielectric may be integrated with the dielectric part 46.

The dielectric part 46 is formed of a dielectric. The dielectric part 46 is formed of, for example, polytetrafluoroethylene (PTFE). The dielectric part 46 is provided between a portion of the gas supply pipe 22 in the longitudinal direction and the cover conductor 44. The dielectric part 46 may extend radially from a portion of the gas supply pipe 22 in the longitudinal direction to an inner surface of the cover conductor 44, and may extend along the circumferential direction so as to surround the portion of the gas supply pipe 22 in the longitudinal direction. In one embodiment, the dielectric part 46 may be provided upwardly from a lower surface 22*b* of the flange 22*f*. That is, the vertical position of the lower end of the dielectric part 46 may be the same as the vertical position of the lower surface 22*b* of the flange 22*f* In one embodiment, as shown in FIG. 2, the dielectric part 46 may fill the space between the gas supply pipe 22 and the cover conductor 44 in a region between the lower surface 22*b* of the flange 22*f* and the upper end 44*t* of the cover conductor 44.

Figure 4:
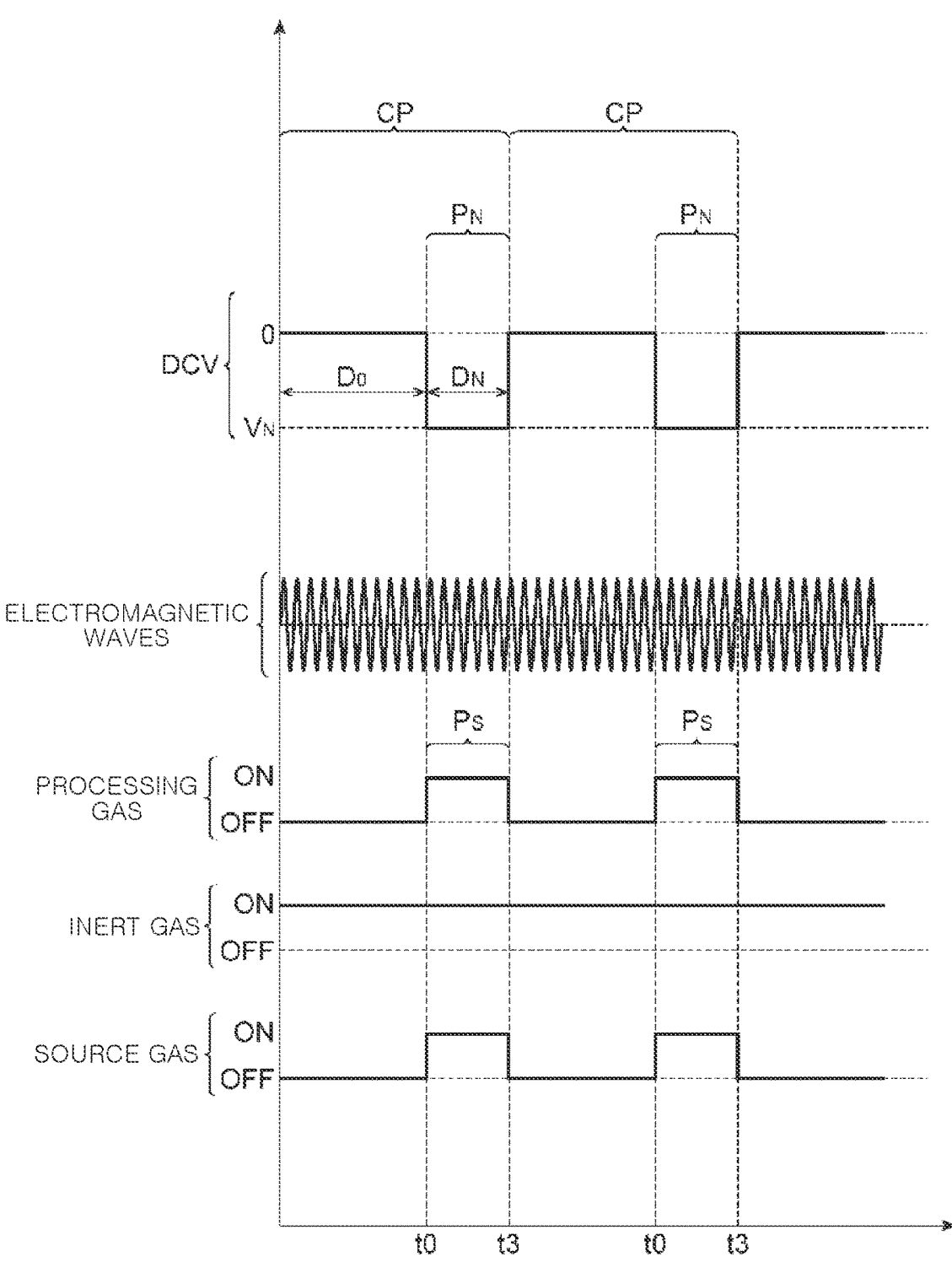
FIG. 4 is an exemplary timing chart related to the plasma processing method shown in FIG. 1.

The plasma processing apparatus 1 further comprises a power supply 50 (first power supply). FIG. 4 will be referred to together with FIG. 2 below. FIG. 4 is an exemplary timing chart related to the plasma processing method shown in FIG. 1. In FIG. 4, "DCV" represents a voltage generated by the power supply 50. In addition, in FIG. 4, "ON" represents that the corresponding gas is being supplied to the chamber 10, and "OFF" represents that the supply of the corresponding gas to the chamber 10 is stopped.

In the plasma processing apparatus 1, the power supply 40 is configured to continuously introduce the electromagnetic waves into the chamber 10 while performing the method MT. The power supply 50 is configured to periodically apply a negative voltage to the upper electrode 20 while the electromagnetic waves are continuously introduced into the chamber 10 from the power supply 40.

The power supply 50 is configured to periodically generate a negative DC voltage $V_N$ as the negative voltage applied to the upper electrode 20. A frequency defining a cycle CP at which the power supply 50 applies the negative DC voltage $V_N$ to the upper electrode 20 may be 400 kHz or more and 13.56 MHz or less. The power supply 50 applies the negative DC voltage $V_N$ to the upper electrode 20 for a period $P_N$ having a time length $D_N$ within the cycle CP. The absolute value of the negative DC voltage $V_N$ applied to the upper electrode 20 by the power supply 50 may be 200 V or more.

In one embodiment, the plasma processing apparatus 1 is configured to connect the upper electrode 20 to ground during periods other than the period $P_N$. For this reason, the plasma processing apparatus 1 may further comprise a switch 50*sw*. The switch 50*sw* is connected between the power supply 50 and the upper electrode 20. The switch 50*sw* is configured to selectively connect the upper electrode 20 to the power supply 50 or to ground.

The gas supply 26 described above supplies the processing gas into the chamber 10 only during the period $P_N$ in which the negative voltage is applied to the upper electrode 20. That is, a period $P_S$ in which the processing gas is supplied into the chamber 10 is the same period as the period $P_N$ or a period within the period $P_N$.

In one embodiment, the plasma processing apparatus 1 may further comprise a controller 60. The controller 60 may be a computer comprising a processor, a storage such as a memory, an input device, a display device, a signal input/output interface, and the like. The controller 60 controls each part of the plasma processing apparatus 1. The storage of the controller 60 stores a control program and recipe data. The control program is executed by the processor of the controller 60 to perform various processes in the plasma processing apparatus 1. The processor of the controller 60 executes the control program and controls each part of the plasma processing apparatus 1 according to the recipe data. The method MT can be performed in the plasma processing apparatus 1 by controlling each part of the plasma processing apparatus 1 by the controller 60.

In the following, referring again to FIG. 1, the method MT will be described taking the case where the plasma processing apparatus 1 is used as an example. As shown in FIG. 1, the method MT includes a step STa, a step STb, and a step STc. In the step STa, the electromagnetic waves from the power supply 40 are introduced into the chamber 10 to generate a plasma from the processing gas. The electromagnetic waves are introduced into the chamber 10 so as to form standing waves along the lower surface of the upper electrode 20. The electromagnetic waves are continuously introduced into the chamber 10 while the method MT is being performed.

The step STb is performed while the step STa is being performed. That is, the step STb is performed while the electromagnetic waves are continuously introduced into the chamber 10. In the step STb, the negative voltage is periodically applied to the upper electrode 20 from the power supply 50. In one embodiment, the negative DC voltage $V_N$ is periodically applied to the upper electrode 20 as the negative voltage.

In the step STc, the processing gas is supplied into the chamber 10 from the gas supply 26. The processing gas is supplied into the chamber 10 only during the period $P_N$. The period $P_S$ in which the processing gas is supplied into the chamber 10 is the same period as the period $P_N$ or a period within the period $P_N$.

As shown in FIG. 4, the inert gas may be continuously supplied into the chamber 10 while the method MT is being performed. The inert gas is supplied into the chamber 10 from the gas supply 28.

Further, as shown in FIG. 4, the source gas may be supplied into the chamber 10 during the period $P_S$. That is, the processing gas and the source gas may be supplied simultaneously into the chamber 10 during the period $P_S$. During periods other than the period $P_S$, the supply of the processing gas and the source gas into the chamber 10 is stopped.

In the method MT, a conductive film or an insulating film may be formed on the substrate W. When forming the conductive film, a silicon-containing gas such as a silane gas (e.g., $SiH_4$ gas or trimethylsilane gas) can be used as the source gas, and a reducing gas such as $H_2$ gas can be used as the processing gas. Alternatively, when forming the conductive film, a metal-containing gas such as a metal halide gas (e.g., $TiCl_4$ gas) can be used as the source gas, and a reducing gas such as $H_2$ gas can be used as the processing gas. When forming the insulating film, a silicon-containing gas such as a silane gas (e.g., $SiH_4$ gas or trimethylsilane gas) can be used as the source gas, and a reducing gas such as $N_2$ gas or $NH_3$ gas can be used as the processing gas. When the method MT is performed according to the timing chart shown in FIG. 4, the film is formed on the substrate W by a plasma-enhanced chemical vapor deposition (CVD) method.

As described above, the processing gas is supplied into the chamber 10 only during the period PN in which the negative voltage is applied to the upper electrode 20. During the period PN in which the negative voltage is applied to the upper electrode 20, the thickness of the sheath directly below the upper electrode 20 increases. When the thickness of the sheath directly below the upper electrode 20 is large, a wavelength of the electromagnetic wave along the lower surface of the upper electrode 20 becomes longer and approaches the wavelength of the electromagnetic wave under vacuum. Therefore, according to the above embodiment, the density distribution of the plasma generated from the processing gas in the chamber 10 is made uniform.

In one embodiment, in each cycle CP, time length Do of a period in which the upper electrode 20 is connected to ground may be 0.5 milliseconds or more. The time length $D_0$ may be 1 millisecond or more.

Figures 5A, 5B:
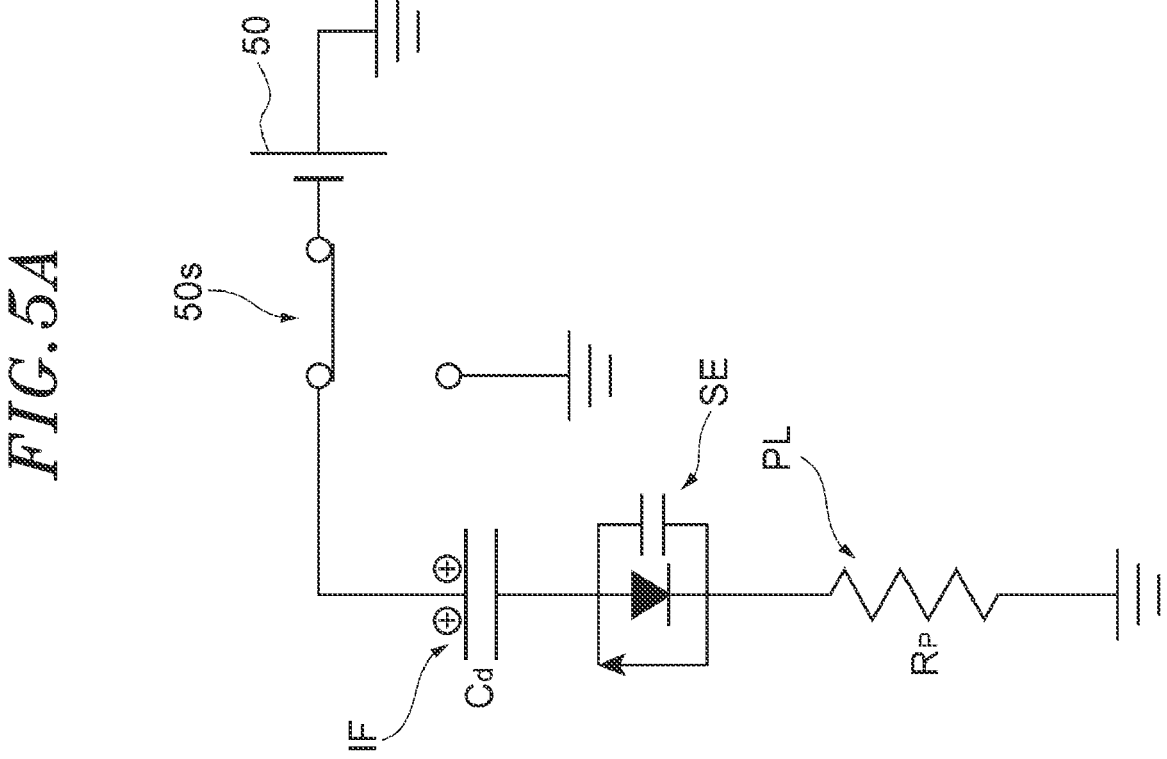
FIG. 5A is a diagram showing an equivalent circuit of the plasma processing apparatus in which a negative voltage is applied to an upper electrode.
FIG. 5B is a diagram showing an equivalent circuit of the plasma processing apparatus in which the upper electrode is connected to ground.

Now refer to FIG. 5A and FIG. 5B. FIG. 5A is a diagram showing an equivalent circuit of the plasma processing apparatus in which the negative voltage is applied to the upper electrode, and FIG. 5B is a diagram showing an equivalent circuit of the plasma processing apparatus in which the upper electrode is connected to ground. These drawings represent the equivalent circuits of the plasma processing apparatus 1 in which an insulating film IF having a thickness dip is formed on the lower surface of the upper electrode 20. A series circuit including the insulating film IF having a capacitance $C_d$, a sheath SE, and a plasma PL having a resistance value $R_P$ is formed between the upper electrode 20 and ground.

As shown in FIG. 5A, when the negative DC voltage $V_N$ is applied to the upper electrode 20, positive charges are accumulated in the upper electrode 20. In the drawing, the circled "+" represents a positive charge. The circuit equation of the equivalent circuit shown in FIG. 5A is expressed by the following Equation (1).

[Equation 1]

$$\frac{Q_d(t)}{C_d} + R_P \frac{d}{dt} Q_d(t) = V_N \tag{1}$$

Here, $Q_d$ represents the amount of positive charge accumulated in the upper electrode 20. Solving Equation (1) under the condition that the amount of the positive charge accumulated in the upper electrode 20 is zero in the initial state, the following Equation (2) is obtained.

[Equation 2]

$$Q_d(t) = C_d V_N (1 - e^{-t/R_P C_d}) \tag{2}$$

As shown in FIG. 5B, when the upper electrode 20 is connected to ground, the positive charges accumulated in the upper electrode 20 flow to ground. The circuit equation of the equivalent circuit shown in FIG. 5B is expressed by the following Equation (3).

[Equation 3]

$$\frac{Q_d(t)}{C_d} + R_P \frac{d}{dt} Q_d(t) = 0 \qquad (3)$$

At the beginning of the period in which the state of FIG. 5B is formed, solving Equation (3) under the condition that an amount of positive charge expressed by $Q_d(t)=C_d V_N$ is accumulated in the upper electrode 20, the following Equation (4) is obtained.

[Equation 4]

$$Q_d(t)=C_d V_N e^{-t/R_P C_d} \qquad (4)$$

According to Equation (4), if $D_0 \gg R_P C_d$, the positive charges accumulated in the upper electrode 20 can be sufficiently discharged from the upper electrode 20 to ground during the period in which the upper electrode 20 is connected to ground. Here, when an alumina film having the thickness dIF of 10 μm is formed on the lower surface (surface) of the upper electrode 20 having a diameter of 330 mm and the resistance value $R_P$ is 50Ω, $R_P C_d$ is 35.6 microseconds. Therefore, when the time length $D_0$ is 0.5 milliseconds or more, the positive charges accumulated in the upper electrode 20 can be sufficiently discharged from the upper electrode 20 during the period in which the upper electrode 20 is connected to ground.

Figure 6:
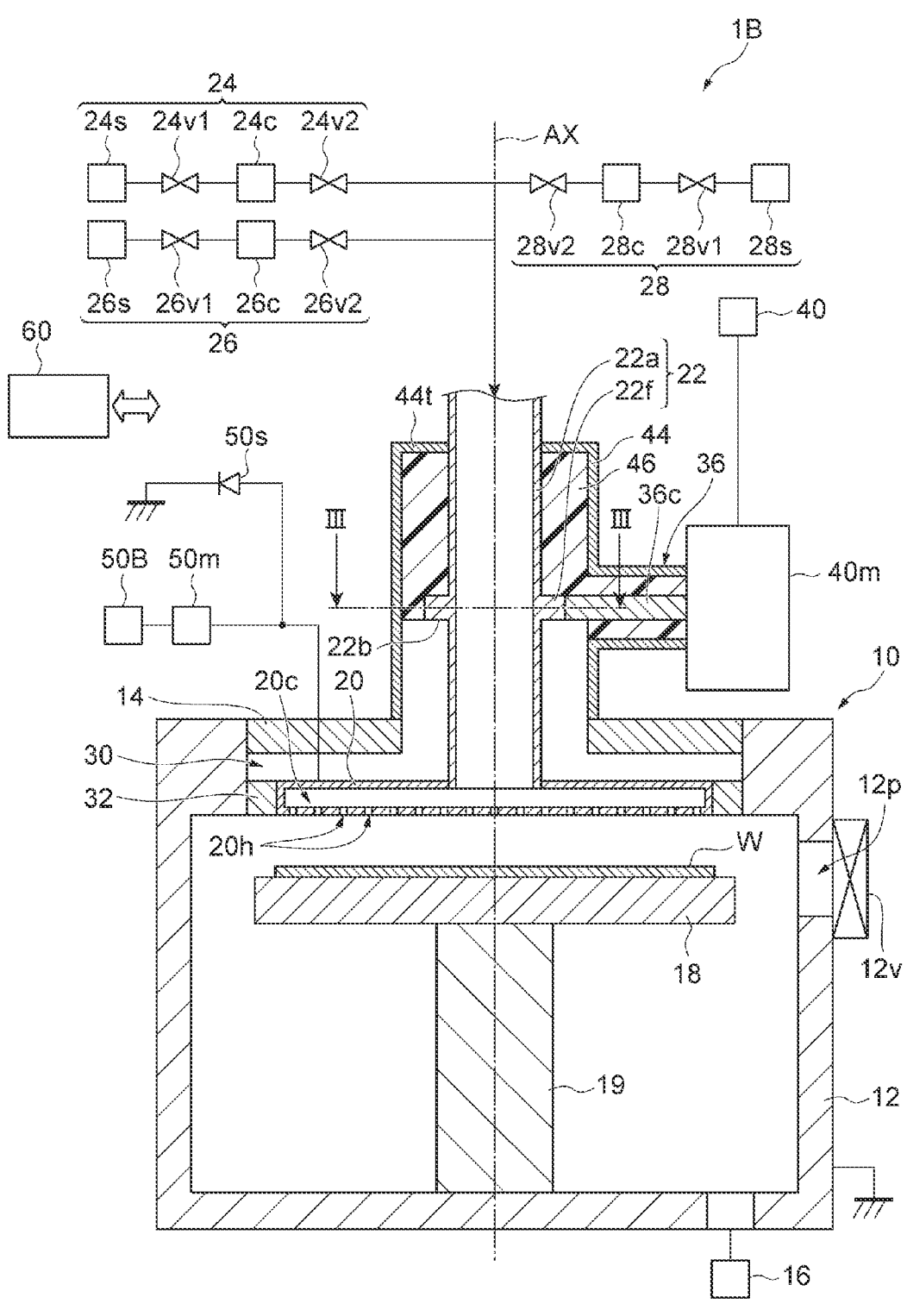
FIG. 6 is a diagram schematically showing a plasma processing apparatus according to another exemplary embodiment.
Figure 7:
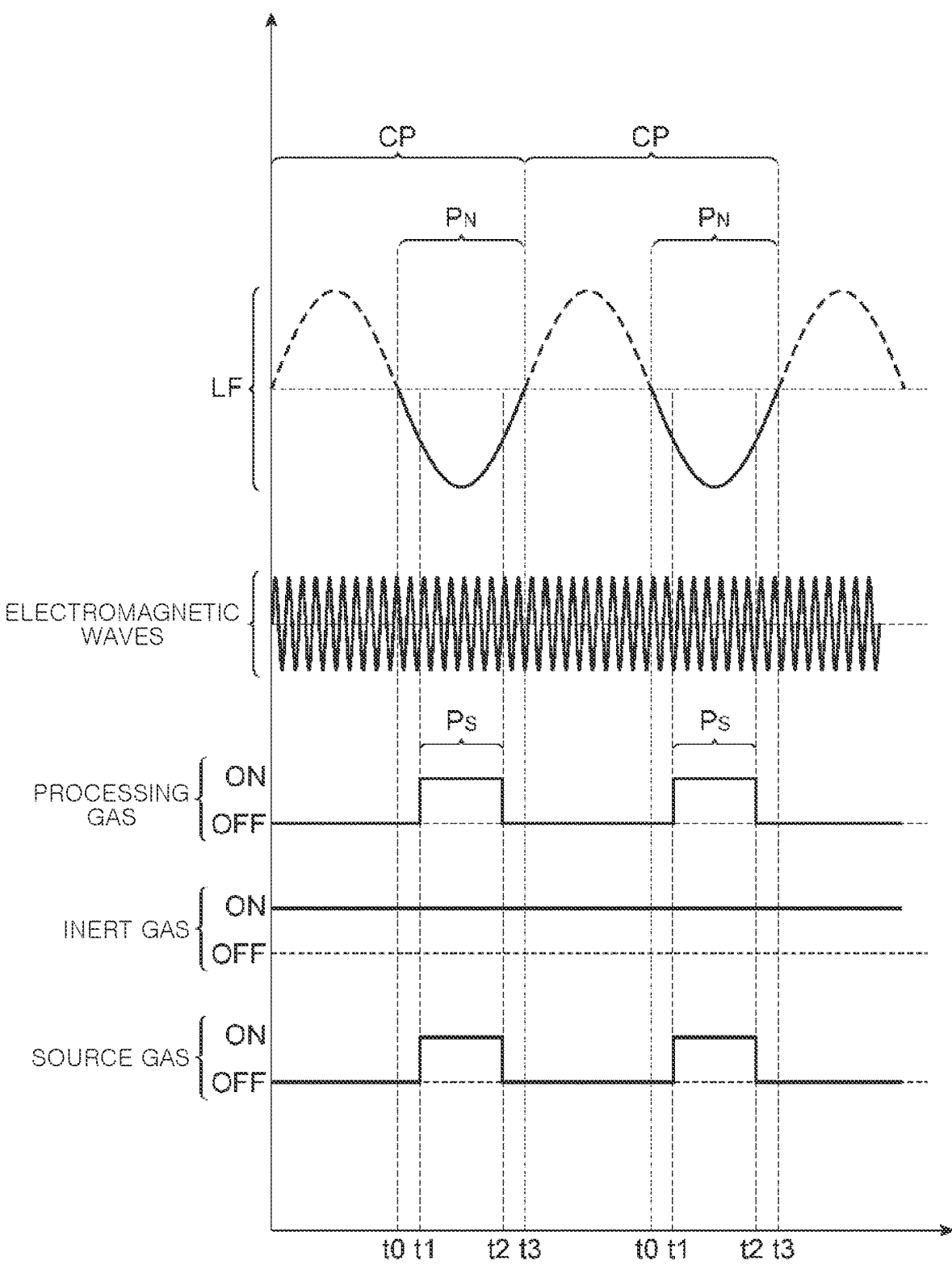
FIG. 7 is another exemplary timing chart related to the plasma processing method shown in FIG. 1.

A plasma processing apparatus according to another exemplary embodiment will now be described with reference to FIG. 6. FIG. 6 is a diagram schematically showing a plasma processing apparatus according to another exemplary embodiment. In the following description, reference will be made to FIG. 7 together with FIG. 6. FIG. 7 is a timing chart of another example related to the plasma processing method shown in FIG. 1. In FIG. 7, "LF" represents a high frequency voltage generated by a power supply 50B. A solid line representing the high frequency voltage LF represents a negative voltage, and a dashed line representing the high frequency voltage LF represents a positive voltage. Further, in FIG. 7, "ON" represents that the corresponding gas is being supplied into the chamber 10, and "OFF" represents that the supply of the corresponding gas into the chamber 10 is stopped.

A plasma processing apparatus 1B shown in FIG. 6 comprises the power supply 50B instead of the power supply 50. Other components of the plasma processing apparatus 1B may be the same as the corresponding components of the plasma processing apparatus 1. The power supply 50B is a high frequency power supply and generates a high frequency voltage LF as shown in FIG. 7. A frequency of the high frequency voltage LF may be 400 kHz or higher and 13.56 MHz or lower. In this embodiment, the power supply 50B is connected to the upper electrode 20 via a matching box 50m. The matching box 50m has an impedance matching circuit. The impedance matching circuit is configured to match the load impedance of the power supply 50B to the output impedance of the power supply 50B. The impedance matching circuit has a variable impedance.

In the plasma processing apparatus 1B, while the electromagnetic waves from the power supply 40 are continuously introduced into the chamber 10, a negative voltage of the high frequency voltage LF from the power supply 50B is applied to the upper electrode 20. Thereby, the negative voltage is periodically applied to the upper electrode 20. As shown in FIG. 6, the plasma processing apparatus 1B may further comprise a waveform shaper 50s. The waveform shaper 50s is configured to shape a waveform of the high frequency voltage LF so as to suppress a positive voltage contained in the high frequency voltage LF. As a result of the suppression of the positive voltage by the waveform shaper 50s, the negative voltage of the high frequency voltage LF is applied to the upper electrode 20 from the power supply 50B. In one embodiment, the waveform shaper 50s may include a diode. An anode of the diode of the waveform shaper 50s is connected to an electrical path between the power supply 50 (or the matching box 50m) and the upper electrode 20. A cathode of the diode of the waveform shaper 50s is connected to ground.

Also in the plasma processing apparatus 1B, the gas supply 26 supplies the processing gas into the chamber 10 only during the period $P_S$. The period $P_S$ is a period within the period $P_N$ in which the negative voltage from the power supply 50B is applied to the upper electrode 20. The period $P_S$ may be a period in which the negative voltage from the power supply 50B has an absolute value equal to or greater than one-half of the maximum absolute value of the negative voltage. The period $P_S$ begins at time t1 and ends at time t2. The times t1 and t2 may satisfy t0<t1<t2<t3 and satisfy t1−t2>(1/6)(t3−t0) and t3−t2>(1/6)(t3−t0). Here, t0 and t3 are the start and end times of the period $P_N$, respectively.

This plasma processing apparatus 1B can be used in the method MT shown in FIG. 1. When the plasma processing apparatus 1B is used, the negative voltage is periodically applied to the upper electrode 20 from the power supply 50B in the step STb.

In the plasma processing apparatus 1B, the negative voltage is applied to the upper electrode 20 by suppressing the positive voltage in the high frequency voltage LF from the power supply 50B. That is, since the application of the positive voltage to the upper electrode 20 is suppressed, an increase in the plasma potential is suppressed. By suppressing the increase of the plasma potential, damage to the substrate W and the chamber 10 by ions is reduced, and a process using high-density plasma becomes possible.

While various exemplary embodiments have been described above, various additions, omissions, substitutions, and modifications may be made without being limited to the exemplary embodiments described above. In addition, elements from different embodiments can be combined to form other embodiments.

From the foregoing description, it will be appreciated that various embodiments of the present disclosure have been described herein for purposes of illustration, and that various changes may be made without departing from the scope and spirit of the present disclosure. Therefore, the various embodiments disclosed herein are not intended to be limiting, the true scope and spirit being indicated by the following claims.

DESCRIPTION OF REFERENCE NUMERALS

1: plasma processing apparatus, 10: chamber, 18: substrate support, 20: upper electrode, 40: power supply, 50: power supply

The invention claimed is:

1. A plasma processing method comprising:
continuously introducing electromagnetic waves into a chamber of a plasma processing apparatus, the electromagnetic waves being very high frequency (VHF)

waves or ultra high frequency (UHF) waves, the electromagnetic waves being introduced into the chamber so as to form standing waves within the chamber along a lower surface of an upper electrode of the plasma processing apparatus;

periodically applying a negative voltage to the upper electrode while performing said continuously introducing the electromagnetic waves; and supplying a processing gas into the chamber only during a period in which the negative voltage is applied to the upper electrode.

2. The plasma processing method of claim 1, wherein the negative voltage is a negative direct current (DC) voltage periodically applied to the upper electrode.

3. The plasma processing method of claim 1, wherein the negative voltage is generated by shaping a waveform of a high frequency voltage to suppress a positive voltage contained in the high frequency voltage.

4. The plasma processing method of claim 1, wherein the upper electrode is connected to ground when the negative voltage is not applied to the upper electrode.

5. The plasma processing method of claim 4, wherein a time length of a period in which the upper electrode is connected to ground is 0.5 milliseconds or more in each cycle including the period in which the negative voltage is applied to the upper electrode.

6. The plasma processing method of claim 1, further comprising:

supplying a source gas into the chamber, wherein the processing gas is a reducing gas that reduces source material adhered on a substrate from the source gas in the chamber.

7. The plasma processing method of claim 6, wherein the source gas and the processing gas are simultaneously supplied into the chamber during the period in which the negative voltage is applied to the upper electrode.

8. A plasma processing apparatus comprising:

a chamber;

a gas supply configured to supply a processing gas into the chamber;

a substrate support provided within the chamber;

an upper electrode provided above the substrate support;

a first power supply configured to periodically apply a negative voltage to the upper electrode; and a second power supply configured to generate electromagnetic waves to generate a plasma from the processing gas in the chamber, the electromagnetic waves being very high frequency (VHF) waves or ultra high frequency (UHF) waves and being continuously introduced into the chamber so as to form standing waves in the chamber along a lower surface of the upper electrode, wherein the gas supply is configured to introduce the processing gas into the chamber only during a period in which the negative voltage is applied to the upper electrode.

9. The plasma processing apparatus of claim 8, further comprising:

an introduction part formed of a dielectric material and provided along an outer periphery of the upper electrode so as to introduce the electromagnetic waves into the chamber therethrough, wherein the upper electrode forms a shower head which introduces the processing gas into the chamber.

10. The plasma processing apparatus of claim 8, wherein the first power supply is configured to periodically apply a negative direct current (DC) voltage to the upper electrode as the negative voltage, and the plasma processing apparatus further comprises a switch configured to connect the upper electrode to ground when the negative voltage is not applied to the upper electrode.

11. The plasma processing apparatus of claim 8, wherein the first power supply is configured to generate a high frequency voltage, and the plasma processing apparatus further comprises a waveform shaper configured to shape a waveform of the high frequency voltage to suppress a positive voltage contained in the high frequency voltage.

*    *    *    *    *